(12) United States Patent
Takeshima

(10) Patent No.: US 6,555,165 B2
(45) Date of Patent: Apr. 29, 2003

(54) METHOD FOR FORMING A THIN FILM AND A THIN FILM FORMING APPARATUS THEREFOR

(75) Inventor: Yutaka Takeshima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/737,186

(22) Filed: Dec. 14, 2000

(65) Prior Publication Data
US 2001/0006705 A1 Jul. 5, 2001

(30) Foreign Application Priority Data

Dec. 24, 1999 (JP) .............................. 11-366348

(51) Int. Cl.$^7$ ............................................ C23C 16/40
(52) U.S. Cl. .............................. 427/248.1; 427/255.32; 427/345
(58) Field of Search ................ 427/248.1, 255.32, 427/345

(56) References Cited

U.S. PATENT DOCUMENTS 5,900,279 A * 5/1999 Hideaki et al. ............. 427/229
5,919,522 A * 7/1999 Baum et al. ............. 427/248.1
6,218,518 B1 * 4/2001 Baum et al. ................ 427/252

FOREIGN PATENT DOCUMENTS

| DE | 19738330 A1 | 4/1998 |
| JP | 07-321039 | 12/1995 |

OTHER PUBLICATIONS

German Office Action dated Jun. 25, 2002, along with an English translation.

* cited by examiner

Primary Examiner—Timothy Meeks
(74) Attorney, Agent, or Firm—Keating & Bennett, LLP

(57) ABSTRACT

A method for forming a thin film comprises the steps of: forming a first thin film using a raw material which comprises an adduct of metal β-diketonate and adduct-forming material by a metal organic chemical vapor deposition (MOCVD) method; associating metal β-diketonate dissociated from the adduct in the raw material with an adduct-forming material to regenerate the raw material; and forming a second thin film using the regenerated raw material by the MOCVD method.

9 Claims, 2 Drawing Sheets

METHOD FOR FORMING A THIN FILM AND A THIN FILM FORMING APPARATUS THEREFOR

BACKGROUND OF THE INVENTION

1. Field of the Invention

The present invention relates to a method for forming a thin film and a forming apparatus therefor. More specifically, it relates to a method for successively forming a plurality of thin films by an MOCVD method and a forming apparatus therefor.

2. Description of the Related Art

The metal organic chemical vapor deposition (MOCVD) method is a well known technique to form a thin film such as a dielectric thin film, for example.

A MOCVD method thin film forming apparatus, shown in FIG. 1, is used for forming a (Ba, Sr)TiO$_3$(Ba$_x$Sr$_{1-x}$TiO$_3$, $0 \leq x \leq 1$) thin film, using, e.g., as raw materials, the following three materials; barium dipivaloyl methanate tetraethylenepentamine adduct ({Ba(C$_{11}$H$_{19}$O$_2$)$_2$(C$_8$H$_{23}$N$_5$)$_2$} {HN(CH$_2$CH$_2$NHCH$_2$CH$_2$NH$_2$)$_2$}), strontium dipivaloyl methanate tetraethylenepentamine adduct ({Sr(C$_{11}$H$_{19}$O$_2$)$_2$(C$_8$H$_{23}$N$_5$)$_2$} {HN(CH$_2$CH$_2$NHCH$_2$CH$_2$NH$_2$)$_2$}), and titanium isopropoxide (Ti(i-OC$_3$H$_7$)$_4$).

The thin film forming apparatus is equipped with raw material containers 51a, 51b and 51c for containing liquid or solid raw materials, a mixer 52 for mixing raw material gases vaporized from each of the raw materials, a film deposition chamber 53 for depositing a film by the MOCVD method using the supplied raw material gas mixture mixed in the mixer 52, and a vacuum pump 54 for maintaining the inside of the above-described film deposition chamber 53 at a specific pressure (vacuum).

When the thin film forming apparatus is used for forming a (Ba, Sr)TiO$_3$ thin film, the following process will be performed.

(1) First, a carrier gas (Ar gas in this case) is supplied to the raw material containers 51a, 51b and 51c in which the temperatures and the pressures (vacuums) are regulated at specific levels, at certain flow rates via mass flow controllers 55a, 55b and 55c, for vaporizing each of the raw materials and for supplying the thus vaporized raw material gases to the mixer 52.

(2) The raw material gas mixture mixed in the mixer 52 and containing the Ar gas is then introduced into the film deposition chamber 53 heated at a specific film deposition temperature employing the vacuum pump 54 such that the deposition chamber 53 reaches to a specific degree of vacuum.

(3) The film deposition chamber 53 is constructed so that O$_2$ gas is introduced into the chamber as an oxidizing gas, at a given flow rate. The raw material gas mixture is introduced into the film deposition chamber 53 together with this O$_2$ gas and blown onto a substrate 60. Through this process, the raw material gas mixture is subjected to a thermal decomposition and combustion reaction to form a (Ba, Sr)TiO$_3$ thin film on the substrate 60.

According to the above-described conventional thin film forming method, since the melting points as well as the vaporization temperatures of the metal dipivaloyl methanate compounds are lowered (that is, the vapor pressures are raised) by forming an adduct compound with tetraethylenepentamine, it is possible to easily handle the metal dipivaloyl methanate compounds in a liquid state, and to manufacture a thin film efficiently, in comparison with the conventional method in which the metal dipivaloyl methanate compounds must be handled as raw material powders, and, therefore, are difficult to handle.

Also in the above-described thin film forming apparatus, since the carrier gas is supplied to the raw material containers 51a, 51b and 51c for vaporizing each of the raw materials, while the insides of the raw material containers 51a, 51b and 51c are evacuated and heated to specific temperatures, it is possible to bubble the carrier gas into the raw materials in order to efficiently vaporize them, and to efficiently convey and supply them to the film deposition chamber 53.

In spite of the above-explained merits, the above-described thin film forming apparatus still has drawbacks. Specifically, dipivaloyl methanate tetraethylenepentamine adduct and strontium dipivaloyl methanate tetraethylenepentamine adduct have to be heated up to 100° C. or more in order to vaporize them for use as raw materials for MOCVD, in spite of their lowered vaporization temperatures.

Furthermore, since tetraethylenepentamine is gradually dissociated from the adduct by heating, which gradually decreases the vaporization temperatures, the vapor pressures of the raw materials (metal dipivaloyl methanate tetraethylenepentamine adduct) decrease with the passage of time. Accordingly, in order to keep the compositions of the thin films formed in plural batches of the film deposition step at a constant level, it is necessary to increase the temperature of the vaporizers, decrease the pressure of the vaporizers or increase the flow amount of the carrier gas, corresponding to each film deposition step (each batch of the film deposition).

In addition, even when these measures are adopted, dissociation of tetraethylenepentamine proceeds, causing a problem of leaving significant amounts of raw materials unusable in the raw material containers.

Furthermore, since the compositions of the raw materials change with the passage of time, there is another problem of gradual change of the properties of the thin film even when efforts are made to maintain the thin film composition constant by regulating the vaporization conditions according to the above-described method.

SUMMARY OF THE INVENTION

The present invention aims at solving the above-described problems, and, accordingly, aims at providing a forming method for forming a thin film having excellent stability of properties, which can decrease the cost for the raw materials by using them effectively, and a thin film forming apparatus therefor.

The method for forming a thin film, comprises the steps of: forming a first thin film using a raw material which comprises an adduct of metal β-diketonate and adduct-forming material by a metal organic chemical vapor deposition (MOCVD) method; associating metal β-diketonate dissociated from the adduct in the raw material with an adduct-forming material to regenerate the raw material; and forming a second thin film using the raw material by the MOCVD method.

The metal β-diketonate is preferably a metal dipivaloyl methanate and the adduct-forming material is preferably tetraethylenepentamine.

The associating step may include the step of contacting a vapor of the adduct-forming material with a liquid of the raw material. In the case, the contacting step is performed while the liquid of the raw material is kept at a temperature lower than the that of the first or second thin film forming step. Alternatively, or in addition, the contacting step is performed while the vapor pressure of the adduct-forming material is kept higher than the vapor pressure of the raw material during the first or second thin film forming step.

The thin film forming apparatus according to the present invention comprises: a raw material container for a raw material comprising an adduct of metal β-diketonate and adduct-forming material; an adduct-forming material container communicated with the raw material container such that a vapor of the adduct-forming material is capable of being supplied to the raw material container; and a film deposition chamber for depositing a thin film by an MOCVD method with a raw material gas supplied from the raw material container.

In supplying an adduct-forming material vapor from the adduct-forming material container to the raw material container, the apparatus may be constructed so that a carrier gas can be supplied to the adduct-forming material container in order to supply the adduct-forming material vapor to the raw material container together with the carrier gas, and either of the following alternatives can be chosen:

(a) supplying the carrier gas via the adduct-forming material container to the raw material container; and (b) supplying the carrier gas to the raw material container without passing through the adduct-forming material container.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1:
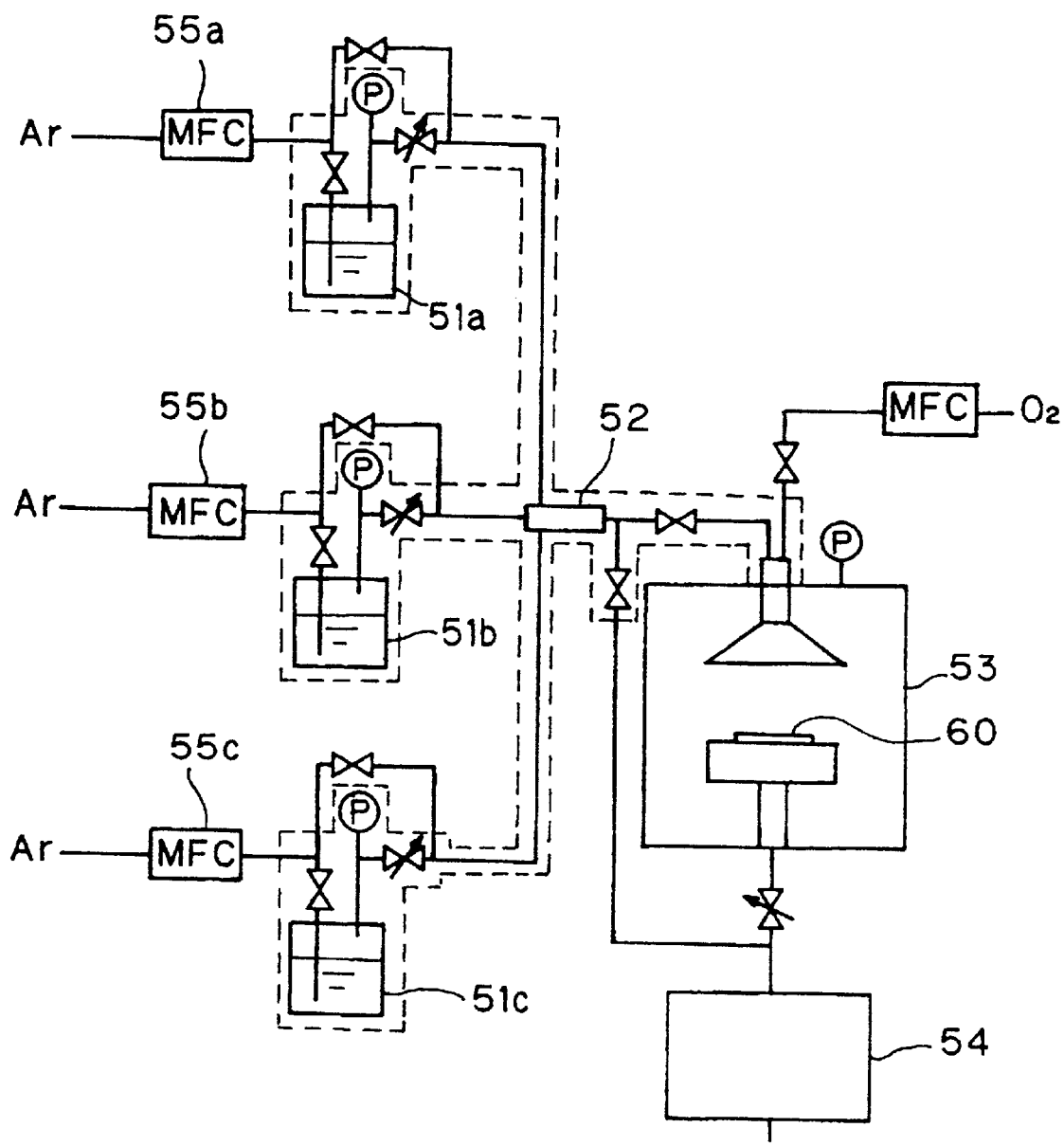
FIG. 1 is a schematic diagram illustrating a conventional thin film forming apparatus.

One of the unique features of the method according to the present invention is that, during successive formation of a plurality of thin films using the an adduct of metal β-diketonate and adduct-forming material as a raw material by MOCVD, the metal β-diketonate dissociated from the adduct in the raw material is associated with an adduct-forming material to regenerate the raw material.

An adduct-forming material associated with metal β-diketonate is dissociated gradually by heating. According to the present invention, the adduct of metal β-diketonate and adduct-forming material is regenerated by associating metal β-diketonate with an adduct-forming material, thereby making it possible to effectively utilize the raw material, to stabilize the composition of the raw material and to stabilize the properties of the thin film.

It is noted that the raw material regeneration treatment can be performed at any one step or more included in the above-described non-deposition step, in consideration of the thin film manufacturing conditions. The treatment can be performed at all of the steps. It can also be performed only at a specific step.

Also, when plural raw materials are used as the raw materials for MOCVD, it is possible to apply the raw material regeneration treatment to all the raw materials comprising an adduct or only to a specific raw material.

Furthermore, the present invention is not limited to a case in which only adducts of metal β-diketonate and an adduct-forming material is used as the raw materials. It can be applied to a case in which both a metal β-diketonate compound including such an adduct and a raw material which does not include an adduct are used.

When the above-described metal β-diketonate compound is a metal dipivaloyl methanate compound, it is possible to efficiently regenerate the metal dipivaloyl methanate tetraethylenepentamine adduct by applying the present invention so that it is possible to effectively utilize the raw material, to stabilize the composition of the raw material and to stabilize the properties of the thin film.

While the vapor pressure of an MOCVD raw material can be increased efficiently by associating tetraethylenepentamine with a metal β-diketonate such as a metal dipivaloyl methanate compound, there is a problem that tetraethylenepentamine which is associated with metal β-diketonate is dissociated gradually by heating, and the raw material cannot be utilized when a certain length of time has passed by, causing a cost hike. However, by applying the regeneration treatment according to the present invention, it is possible to use the raw material efficiently, to stabilize the composition of the raw material and to stabilize the properties of the thin film.

Regeneration of the raw material through efficient adduct formation of an adduct-forming material with the raw material is preferably made by contacting a vapor of the adduct-forming material with a liquid of the metal β-diketonate. In this case, it is preferable that the liquid of the raw material is kept at a temperature lower than that of the first or second thin film forming step or the contacting step is performed or the vapor pressure of the adduct-forming material is kept higher than the vapor pressure of the raw material during the first or second thin film forming step. Alternatively, both of the two conditions may be employed at the same time. By these conditions, it is possible to prevent the dissociation of the adduct and achieve the regeneration of the adduct at high efficiency.

The thin film manufacturing apparatus according to the present invention is characterized by comprising: a raw material container in which is a raw material comprising an adduct of metal β-diketonate and adduct-forming material; an adduct-forming material container communicated with the raw material container such that a vapor of the adduct-forming material is able to be supplied to the raw material container; and a film deposition chamber for depositing a thin film by the MOCVD method with a raw material gas supplied from the raw material container.

The thin film manufacturing apparatus according to the present invention is constructed so that the adduct-forming material container is connected with the raw material container, and thus a vapor of the adduct-forming material can be supplied to the raw material container through the connection to the above-described raw material container in the above-described raw material regeneration step. Therefore, it is possible to efficiently regenerate the raw material and to manufacture a thin film excellent in stabilization of the properties, with little redundant raw materials and at a decreased cost.

It is noted that the present invention does not exclude a manufacturing apparatus which is constructed so that a different type of raw material which does not include an adduct-forming material is used together, and it can also be applied to a thin film manufacturing apparatus in which both a metal β-diketonate compound including an adduct-forming material and a raw material which does not include an adduct-forming material are used.

In supplying the adduct-forming material vapor from the adduct-forming material container to the raw material container, it can be chosen whether the carrier gas is supplied via the adduct-forming material container to the raw material container or it is supplied to the raw material container without passing through the adduct-forming material container, and it is possible to efficiently supply the adduct-forming material vapor to the raw material container by supplying the carrier gas to the raw material container via the adduct-forming material containers only in the raw material regeneration step, thus further facilitating the present invention.

Hereinafter, the preferred embodiments of the present invention are explained in detail with reference to the drawings.

Thin Film Forming Apparatus

Figure 2:
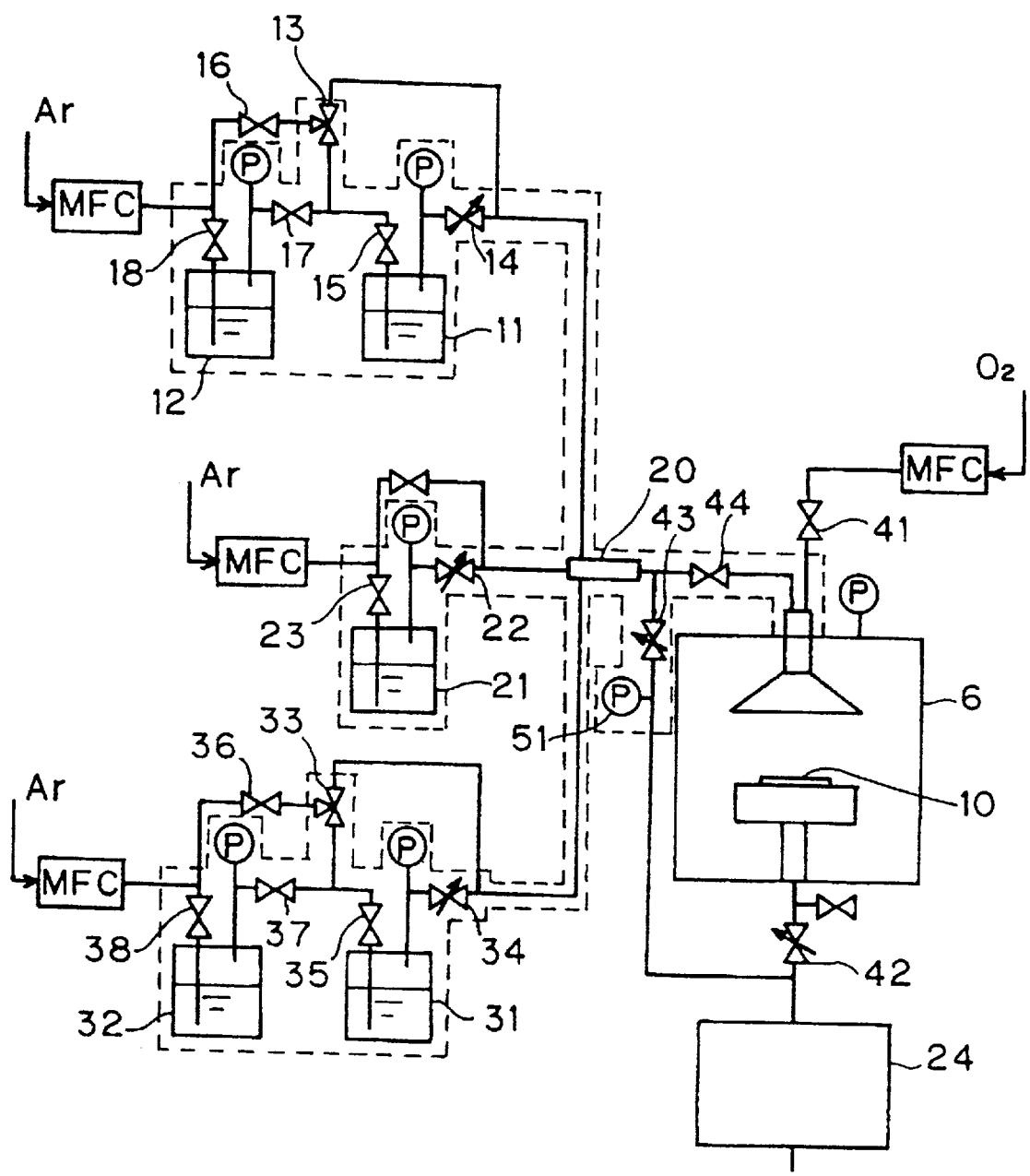
FIG. 2 is a schematic diagram illustrating a thin film forming apparatus according to the present invention.

FIG. 2 is an illustrative view showing a thin film forming apparatus for use in performing a method for forming the thin film according to the present invention.

The thin film forming apparatus in this embodiment is equipped with raw material containers (vaporizers) 11, 21 and 31 for containing MOCVD raw materials, containers for containing an adduct-forming material (adduct-forming material containers) 12 and 32 which are connected to the raw material containers 11 and 31, a mixer 20 for mixing raw material gases supplied from each of the raw material containers 11, 21 and 31, a film deposition chamber 6 for performing film deposition by an MOCVD method using the raw material gas mixture supplied from the mixer 20 where the gases have been mixed, and a vacuum pump 24 for an evacuation purpose.

It is noted that the part enclosed with a dotted line in FIG. 2, including the raw material containers 11, 21 and 31, the adduct-forming material containers 12 and 32, the mixer 20, and pipes (lines) covering the region up to the film deposition chamber 6, is constructed so that it can be maintained at a specific temperature by heating.

Furthermore, the raw material containers 11, 21 and 31, the adduct-forming material containers 12 and 32, and the film deposition chamber 6 are constructed so that the inside pressures (vacuums) can be maintained at specific levels by the vacuum pump 24.

The raw material container (vaporizer) 11 contains, as an MOCVD raw material, barium dipivaloyl methanate tetraethylenepentamine adduct ($\{Ba(C_{11}H_{19}O_2)_2(C_8H_{23}N_5)_2\}\{HN(CH_2CH_2NHCH_2CH_2NH_2)_2\}$), the raw material container 21 contains titanium isopropoxide ($Ti(i-OC_3H_7)_4$), and the raw material container 31 contains strontium dipivaloyl methanate tetraethylenepentamine adduct ($\{Sr(C_{11}H_{19}O_2)_2(C_8H_{23}N_5)_2\}\{HN(CH_2CH_2NHCH_2CH_2NH_2)_2\}$).

Among these raw materials for MOCVD, ($\{Ba(C_{11}H_{19}O_2)_2(C_8H_{23}N_5)_2\}$ $\{HN(CH_2CH_2NHCH_2CH_2NH_2)_2\}$) contained in the raw material container 11 and $Ti(i-OC_3H_7)_4$ contained in the raw material container 21 are liquids at room temperature, and ($\{Ba(C_{11}H_{19}O_2)_2(C_8H_{23}N_5)_2\}\{HN(CH_2CH_2NHCH_2CH_2NH_2)_2\}$) contained in the raw material container 31 is a solid at room temperature with a melting point of nearly 70° C.

Furthermore, adduct-forming material containers 12 and 32 which contain tetraethylenepentamine as an adduct-forming material are connected to the upstream sides of the raw material container (B a raw material container) 11 and the raw material container (Sr raw material container) 31.

It is noted that the adduct-forming material containers are not connected with the raw material container (Ti raw material container) 21, since titanium isopropoxide ($Ti(i-OC_3H_7)_4$) as a titanium raw material does not include an adduct-forming material.

The thin film forming apparatus according to this embodiment is also equipped with pipes for supplying the carrier gas to the raw material containers 11, 21 and 31, and to the adduct-forming material containers 12 and 32, pipes for supplying the raw material gases to the mixer 20, a pipe for supplying the raw material gas mixture mixed in the mixer 20 to the film deposition chamber 6, and valves installed on these pipes. The functions (operations) of these pipes and valves will be explained step by step in the course of explaining the following method for forming a $(Ba, Sr)TiO_3$ thin film.

Forming of a $(Ba, Sr)TiO_3$ Thin Film

Next, a method for forming a $(Ba, Sr)TiO_3$ thin film using the thin film forming apparatus which is constructed as descried above, will be explained. It is noted that Table 1 describes typical conditions for forming a $(Ba, Sr)TiO_3$ thin film.

TABLE 1

| | |
|---|---|
| Temperature of Ba raw material container | 130° C. |
| Pressure of Ba raw material container | 30 Torr |
| Flow rate of carrier gas to Ba raw material container | 50 mL/min |
| Temperature of Sr raw material container | 110° C. |
| Pressure of Sr raw material container | 30 Torr |
| Flow rate of carrier gas to Sr raw material container | 30 mL/min |
| Temperature of Ti raw material container | 40° C. |
| Pressure of Ti raw material container | 250 Torr |
| Flow rate of carrier gas to Ti raw material container | 20 mL/min |
| Temperature of substrate | 650° C. |
| Flow rate of $O_2$ gas | 900 mL/min |
| Pressure of film deposition chamber | 10 Torr |
| Duration of film deposition | 60 min |

A method for forming a $(Ba, Sr)TiO_3$ thin film according to the conditions described in Table 1 will be explained below.

(1) First, only $O_2$ as an oxidizing agent is supplied to the substrate (MgO substrate) 10 in the film deposition chamber 6, wherein a valve 41 installed on the pipe for supplying $O_2$ to the film deposition chamber 6, a valve 42 installed on the pipe connecting the vacuum pump 24 and the film deposition chamber 6, and a valve 43 installed on the pipe connecting the mixer 20 and the vacuum pump 24 for bypassing the film deposition chamber 6, are opened, and the other valves are closed.

(2) Next, heating of the raw material containers 11, 21 and 31, each of the pipes, and the substrate 10 in the film deposition chamber 6, is started, while keeping the inside of the film deposition chamber 6 at a specific pressure (vacuum).

(3) Then, the valves 14, 15, 16, 22, 23, 34, 35 and 36, installed on the pipes for supplying the raw materials, are opened while the temperatures of all of the raw material containers (raw materials), pipes, and the substrate 10, are kept at specific values, to allow a specific amount of a carrier gas (Ar gas) to flow into each of the raw material containers 11, 21 and 31, and to evacuate the raw material containers (vaporizers) 11, 21 and 31 until specific degrees of vacuum are reached.

At this point, a three-way valve 13 is set to be conducted to the pipes connecting the Ba raw material container 11 and the adduct-forming material container 12, respectively, and a three-way valve 33 is set to be conducted to the pipes connecting the Sr raw material container 31 and the adduct-forming material container 32.

(4) Next, the variable flow valve 43 is regulated so that the pressure of the upstream side of the mixer 20 (the side on which the raw material containers 11, 21 and 31 are located) has a specific pressure (vacuum), which is indicated by a pressure gauge 51. The variable flow valves 14, 22 and 34 are also regulated so that each of the raw material containers (vaporizers) 11, 21 and 31 is regulated to have a specific pressure (vacuum).

This pressure regulation is made to avoid sudden fluctuation of the pressures of the raw material containers (vaporizers) 11, 21 and 31 at the time of film deposition, that is, when the valve 43 on the pipe for supplying $O_2$ to the film deposition chamber 6 is closed and the valve 44 is opened for supplying the raw material gas mixture. The target pressure (vacuum) has been determined beforehand through preliminary experiments. After the completion of the pressure regulation, the pressure is held for a determined period of time to stabilize the amount of each vaporized raw material.

(5) Then, after a specific period of time has passed, the valve 43 is closed, and the valve 44 is opened to introduce the raw material gas mixture into the film deposition chamber 6 for starting film deposition.

(6) When the film deposition is completed, the valve 44 is closed, the valve 43 is opened, and the valve 42 on the pipe connecting the film deposition chamber 6 and the vacuum pump 24 is closed to return the pressure of the film deposition chamber 6 to atmospheric pressure. Then annealing is conducted in an oxygen atmosphere for one hour, followed by cooling.

(7) Furthermore, regarding the raw material supplying system, a valve 22 on the pipe connecting the Ti raw material container 21 and the mixer 20 is closed to return the pressure of the container to atmospheric pressure, followed by cooling.

Regeneration of the Raw Materials (1) The Ba raw material and the Sr raw material are cooled while flowing the carrier gas until they are cooled down to the temperatures indicated in Table 2. When the temperatures become stabilized, the three-way valves 13 and 33 are switched to the side conducting to the mixer 20.

TABLE 2

| Temperature of Ba raw material container | 100° C. |
|---|---|
| Temperature of adduct-forming material container on Ba raw material side | 103° C. |
| Temperature of Sr raw material container | 80° C. |
| Temperature of adduct-forming material container on Sr raw material side | 83° C. |

(2) Then the valves 16 and 36 on the pipes for conducting the carrier gas to the raw material containers 11 and 31 bypassing the adduct-forming material containers 12 and 32, are closed, and the valves 17, 18, 37, and 38 on the pipes connecting the adduct-forming material containers (tetraethylenepentamine containers) 12 and 32 to the raw material containers 11 and 31, are opened. It is noted that the adduct-forming material containers 12 and 32 have been maintained at the temperatures indicated in Table 2.

The temperatures of the adduct-forming material containers 12 and 32 are calculated by the pressure difference between the raw material container 11 or 31, and the adduct-forming material container 12 or 32, and the vapor pressure curve of tetraethylenepentamine, and they are set so that the amounts of vaporized tetraethylenepentamine in the raw material container 11 and the adduct-forming material container 12, or in the raw material container 31 and the adduct-forming material container 32 are approximately the same. Furthermore, the pipes including the valves located before or after the raw material containers 11 and 31 are maintained at temperatures 30° C. higher than those of the raw material containers 11 and 31, and the pipes including the valves located before or after the adduct-forming material containers (tetraethylenepentamine containers) 12 and 32 are maintained at temperatures 10° C. higher than those of the adduct-forming material containers 12 and 32.

(3) In this state, the carrier gas heated at the respective vaporization temperature of the raw materials is flown into the raw material containers 11 and 31. The state is maintained for a specific period of time.

It is noted that the pressures of the raw material containers 11 and 31 are set to about 16 Torr and about 11 Torr, respectively.

(4) After that, the valves 14 and 34 installed on each pipe for supplying the raw materials are closed, the valves 15, 17, 18, 35, 37 and 38 are closed while the raw material containers 11 and 31 are under atmospheric pressure, and the raw material containers 11 and 31 as well as the adduct-forming material containers 12 and 32 are cooled.

(5) Furthermore, the valves 16 and 36 on the pipes for bypassing the adduct-forming material containers 12 and 32 are opened, as appropriate, in order to remove tetraethylenepentamine in the pipes by purging with the career gas.

Thus, regeneration of the raw materials (the Ba raw material and the Sr raw material) in the raw material containers 11 and 31 is accomplished.

By the thin film forming method according to the present invention, since it is possible, as described above, to regenerate a metal dipivaloyl methanate adduct, it is possible not only to efficiently utilize the raw materials, to decrease redundant raw materials and to decrease the production cost, but also to efficiently manufacture a thin film having good stabilization of the properties, avoiding the fluctuation of the compositions of the raw materials.

Evaluation of Properties (Ba, Sr)$TiO_3$ thin films manufactured according to the method described above are subjected to analysis of the compositions and measurement of the dielectric constants. The results are shown in Table 3.

TABLE 3

| No. of uses of raw materials | Working example | | | | Comparative example | | | |
|---|---|---|---|---|---|---|---|---|
| | Composition of thin film (mol %) | | | | Composition of thin film (mol %) | | | |
| | Ba (%) | Sr (%) | Ti (%) | Dielectric constant | Ba (%) | Sr (%) | Ti (%) | Dielectric constant |
| 2 | 30 | 19 | 51 | 760 | 30 | 20 | 50 | 780 |
| 3 | 30 | 20 | 50 | 800 | 29 | 20 | 51 | 800 |
| 4 | 29 | 20 | 51 | 770 | 29 | 19 | 52 | 780 |
| 5 | 31 | 19 | 50 | 800 | 29 | 18 | 53 | 760 |
| 6 | 29 | 19 | 52 | 790 | 27 | 16 | 57 | 600 |
| 7 | 30 | 19 | 51 | 790 | 24 | 15 | 61 | 420 |
| 8 | 29 | 21 | 50 | 780 | 20 | 11 | 69 | 290 |
| 9 | 29 | 20 | 51 | 760 | 14 | 8 | 78 | 160 |
| 10 | 30 | 20 | 50 | 780 | 13 | 6 | 81 | 130 |
| 11 | 28 | 21 | 51 | 770 | 8 | 6 | 84 | 80 |

It is noted that Table 3 shows the compositions and dielectric constants measure from the (Ba, Sr)$TiO_3$ thin films obtained in the second batch through to the eleventh batch of use of the raw materials in the course of film deposition starting with 5 grams of the Ba raw material and 5 grams of the Sr raw material, respectively in the raw material containers.

Film deposition experiments using raw materials without the regeneration treatment were also performed as a comparative example, and the compositions and the dielectric constants of the (Ba, Sr) TiO₃ thin films obtained were measured. The also shown in Table 3.

From Table 3, it is understood that while in the comparative example in which the raw material regeneration treatment was not performed, the Ba and Sr amounts in the thin film compositions decreased sharply, and the dielectric constants also decreased sharply when the number of uses of the raw materials exceeded 5, and that, when the raw material regeneration treatment was preformed each time after the completion of film deposition step (that is, in the case of the working example according to the present invention), the fluctuation of the thin film compositions was small and the dielectric constants were stable in the range of 760 to 800.

Furthermore, although it is not shown in Table 3, the film thickness of the dielectric body decreased down to 120 nm at the eleventh batch using the raw materials as compared with 200 nm at the second batch in the comparative example, while in the working examples, the film thicknesses of the dielectric bodies were all within the range of 200±10 nm for all the film deposition batches, showing almost no recognizable decrease when the number of uses of the raw materials was increased.

From these results, it is understood that according to the forming method of the present invention, a thin film having a more stabilized thin film composition and a more stabilized dielectric constant as well as less fluctuation of the film thickness, can be manufactured efficiently, as compared with the method described in the comparative example (prior art thin film forming method) without regeneration of the raw materials.

It is noted that the stabilized composition and the stabilized dielectric constant of the thin film obtained by the thin film forming method according to the present invention results from the fact that it is possible to efficiently associate the metal β-diketonate dissociated from the adduct in the raw material with an adduct-forming material by supplying the vapor of the adduct-forming material to the metal β-diketonate in a heated state, and thus the vaporization state and the composition of the vaporized raw material gases are stabilized at the time of film deposition.

Although it is possible to freely choose the temperatures for the raw materials in the regeneration step, it is not desirable to increase them up near to the vaporization temperatures, since vaporization of the raw materials will occur in the regeneration step, too, resulting in a larger loss of the raw materials. Also, it is not desirable to have too low temperatures for the raw materials in the regeneration step, since the recombination reaction will proceed with difficulty, resulting in a longer time required for the regeneration step. Therefore, it is desirable to have the raw material temperatures in the regeneration step about 10 to 50° C. lower than the vaporization temperatures of the raw materials.

Also, if the raw material is a Sr raw material and its temperature is lowered too much at the regeneration step, an increase in viscosity and solidification will occur. It is necessary, therefore, to choose a raw material temperature which does not cause a large increase of the viscosity or solidification.

It is noted that since, in this embodiment, the pressures of the adduct-forming material containers are determined when the pressures of the raw material containers and the flow amounts of the carrier gas are determined, the temperatures of the adduct-forming material are determined by the pressure differences and the vapor pressure curve.

Also, although according to the method described in the above-described embodiment, there is a possibility that unreacted tetraethylenepentamine may remain in the raw material containers at the termination of the raw material regeneration step, there is a step before the film deposition in which the amounts of vaporized materials are stabilized by temperatures higher than those at the regeneration step, and free tetraethylenepentamine is vaporized in this step, resulting in no effect on the film deposition.

Although, in the above-described embodiment, the explanation is limited to the example in which the regeneration treatment is performed using barium dipivaloyl methanate and strontium dipivaloyl methanate adducted with tetraethylenepentamine as the MOCVD raw materials, the present invention is not limited to the embodiment, and barium dipivaloyl methanate and strontium dipivaloyl methanate adducted with another adduct-forming material such as triethylenetetramine, phenanthroline or tetraglyme can be applied as MOCVD raw materials with similar effect.

It is noted that a method for supplying raw materials including a sufficient amount of an adduct-forming material to the film deposition chamber by supplying a carrier gas to the raw material containers through the adduct-forming material containers also in the film deposition step, can be considered as one of the methods for achieving the purpose of the present invention. However, when film deposition is performed according to this method, there was observed a tendency that the dielectric constant of the formed thin film decrease by 30% or more, although the film composition and the film properties were stabilized. It is believed that this was caused by the adverse effects on film deposition by the adduct-forming material vapor which was supplied together with the raw material gas to the film deposition chamber but was not necessary for the film deposition, and by the decomposed gases therefrom, or gases generated from the combustion. Therefore, it is believed desirable to supply the carrier gas to the raw material containers without passing through the adduct-forming material containers, as described in the above-described embodiment of the present invention.

The present invention is not limited to the above-described embodiment further in other points, and various applications and modifications are possible regarding the concrete conditions in the film deposition step and the raw material regeneration step, as long as they are within the scope of the gist of the present invention.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method for forming a thin film, comprising the steps of:
   forming a first thin film from a raw material which comprises an adduct of metal β-diketonate and adduct-forming material by a metal organic chemical vapor deposition (MOCVD) method;
   associating metal β-diketonate dissociated from the adduct in the raw material with an adduct-forming material to regenerate the raw material; and
   forming a second thin film using the regenerated raw material by the MOCVD method;
   wherein the metal β-diketonate is a metal dipivaloyl methanate, the adduct-forming material comprises tetraethylenepentamine, and the associating step comprises the step of contacting a vapor of the adduct-forming material with a liquid of the residual raw material from the first thin film formation.

2. A method for forming a thin film according to claim 1, wherein the metal comprises at least one of Ba and Sr.

3. A method for forming a thin film according to claim 1, wherein the contacting step is performed while the liquid of the residual raw material is at a temperature lower than the temperature of the raw material or regenerated raw material during the first or second thin film forming step.

4. A method for forming a thin film according to claim 1, wherein the contacting step is performed while the adduct-forming material has a vapor pressure which is higher than the vapor pressure of the raw material or regenerated raw material during the first or second thin film formation.

5. A method for forming a thin film, comprising the steps of:

forming a first thin film from a raw material which comprises an adduct of metal β-diketonate and adduct-forming material by a metal organic chemical vapor deposition (MOCVD) method;

associating metal β-diketonate dissociated from the adduct in the raw material with an adduct-forming material to regenerate the raw material; and forming a second thin film using the regenerated raw material by the MOCVD method;

wherein the associating step comprises the step of contacting a vapor of the adduct-forming material with a liquid of the residual raw material from the first thin film formation.

6. A method for forming a thin film according to claim 5, wherein the contacting step is performed while the liquid of the residual raw material is at a temperature lower than the temperature of the raw material or regenerated raw material during of the first or second thin film forming step.

7. A method for forming a thin film according to claim 5, wherein the contacting step is performed while the adduct-forming material or regenerated raw material during the first or second thin film formation.

8. A method for forming a thin film, comprising the steps of:

forming a first thin film from a raw material which comprises an adduct of metal β-diketonate and adduct-forming material by a metal organic chemical vapor deposition (MOCVD) method;

associating metal β-diketonate dissociated from the adduct in the raw material with an adduct-forming material to regenerate the raw material; and forming a second thin film using the regenerated raw material by the MOCVD method;

wherein during formation of the first and second thin films, the raw material and regenerated raw material are conveyed from a supply thereof to a MOCVD deposition chamber in combination with an inert carrier, and wherein during the association, the adduct-forming material is conveyed from a supply thereof to the supply of raw material in combination with an inert carrier.

9. A method for forming a thin film, comprising the steps of:

forming a first thin film from a raw material which comprises an adduct of metal β-diketonate and adduct-forming material by a metal organic chemical vapor deposition (MOCVD) method;

associating metal β-diketonate dissociated from the adduct in the raw material with an adduct-forming material to regenerate the raw material; and forming a second thin film using the regenerated raw material by the MOCVD method;

wherein an inert carrier is conveyed from a supply thereof to a supply of the raw material and regenerated raw material and during formation of the first and second thin films, the raw material and regenerated raw material are conveyed from the supply thereof to a MOCVD deposition chamber in combination with the inert carrier, and wherein during the association, the adduct-forming material supply is isolated from the inert carrier supply.

* * * * *